United States Patent [19]

Prest, Jr. et al.

[11] 4,391,537
[45] Jul. 5, 1983

[54] SELECTIVELY ALTERING THE BULK PROPERTIES OF POLYMER STRUCTURES

[75] Inventors: William M. Prest, Jr.; Frederick J. Roberts, Jr., both of Webster, N.Y.

[73] Assignee: Xerox Corporation, Stamford, Conn.

[21] Appl. No.: 327,147

[22] Filed: Dec. 3, 1981

[51] Int. Cl.³ .............................. B41J 1/30; B05D 3/06
[52] U.S. Cl. ................................ 400/144.2; 400/174; 427/35; 427/44
[58] Field of Search ............................ 427/35, 36, 44; 400/144.2

[56] References Cited

U.S. PATENT DOCUMENTS

| 2,940,869 | 6/1960 | Graham | 427/36 |
| 2,956,899 | 10/1960 | Cline | 117/47 |
| 3,088,791 | 5/1963 | Cline et al. | 427/36 |
| 3,090,664 | 5/1963 | Cline et al. | 8/115.5 |
| 3,115,418 | 12/1963 | Magat et al. | 117/47 |
| 3,188,228 | 6/1965 | Magat et al. | 427/36 |
| 3,188,229 | 6/1965 | Graham | 117/62 |
| 3,201,336 | 8/1965 | Magat et al. | 204/154 |
| 3,281,263 | 10/1966 | Priesing et al. | 117/62 |
| 3,414,498 | 12/1968 | Shinohara et al. | 204/159.13 |
| 3,616,370 | 10/1971 | Jennings | 204/159.15 |
| 3,670,048 | 6/1972 | Magat et al. | 260/857 G |
| 3,681,216 | 8/1972 | Galiano et al. | 204/159.14 |
| 3,954,163 | 5/1976 | Gabor | 197/53 |
| 4,018,639 | 4/1977 | Staples, Jr. | 156/73.1 |
| 4,037,706 | 7/1977 | Sohl et al. | 197/54 |
| 4,165,189 | 8/1979 | Bauer | 400/144.2 |

*Primary Examiner*—John H. Newsome

[57] ABSTRACT

A method for selectively hardening and toughening the bulk mass of predetermined portions of a polymeric structure which includes the steps of contacting the polymeric structure with a multifunctional monomer to diffuse the monomer into the polymeric structure and irradiating the predetermined portions of the polymeric structure with activating radiation to cause the bulk polymeric material at those portions to be hardened and toughened. In a preferred embodiment the character fonts of a print wheel made from nylon 66 are contacted with a multifunctional monomer which is subsequently exposed to electron beam radiation whereby a structural network of monomer or monomer reactive with polymer or mixtures is formed.

18 Claims, 3 Drawing Figures

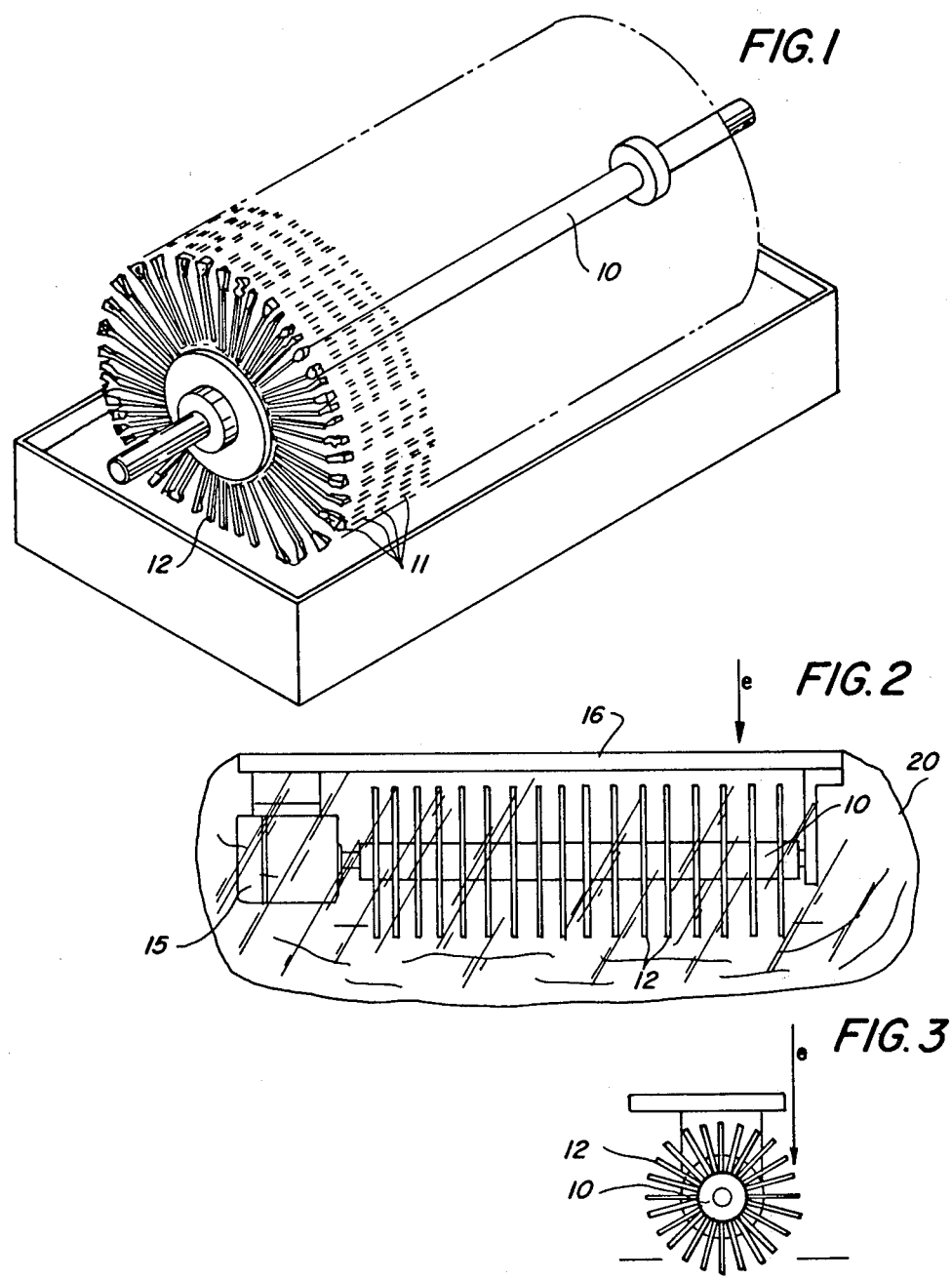

SELECTIVELY ALTERING THE BULK PROPERTIES OF POLYMER STRUCTURES

This invention relates to a process for making improved polymeric structures. More particularly, it concerns a method for selectively altering the bulk properties of predetermined portions of a polymeric structure. In a specific embodiment, the invention is directed to selectively hardening the character fonts of a print wheel.

BACKGROUND OF THE INVENTION AND PRIOR ART

In impact printing, a hammer like device is used to impart a slug carrying a print font against an ink carrier and a record medium, such as ordinary paper, which is backed by a platen. The platen is an anvil for the hammers blow. The ink carrier is conventionally a ribbon, i.e. an elongated web impregnated with ink. The ink is transferred to the paper record medium when the two are brought into intimate contact and by the blow of the hammer. Ink is released from the ribbon in raised areas in the slug corresponding to the shape of the character font. Broadly, a serially impact printer is one in which a line of print is inscribed one character at a time. Classic examples of serial printers are the familiar office typewriter, teletypewriter printers, and low speed computer output printers. Other classic impact imprint printers include calculating machines, such as adding machines, and business accounting machines which use mostly numerical characters.

Printing elements for serial printers shaped generally in the form of a wheel or the like have been known for some time. U.S. Pat. No. 3,954,163 describes a serial printer which has a print wheel having a plurality of slugs located at the ends of spokes or beams extending radially outward from the hub. The print wheel is rotated by a servo mechanism to position selected characters opposite a hammer and ribbon at the printing station. The print wheel employed is basically a single element structure in which the beams and slugs are integrally molded thermoplastic structure. This print wheel delivers superior performance with very favorable economics i.e. the integral wheel is relatively inexpensive to manufacture. Nevertheless, once subjected to long time useage or useage where high print qualities are required, the integral structure print wheel does not always give the desired print quality.

Specifically the molded single piece plastic print wheel has elements in its structure which require different mechanical properties. The spokes must be flexible so that when they are struck, they readily bend forward to strike the ribbon and paper and immediately return to the home position. The character font on the other hand must be very hard and not deform under impact. As a result of these, somewhat opposite requirements the print wheels are essentially a compromise of properties required for the spokes and the character fonts. Over continued use the character fonts tend to either wear away or have portions break off both of which lead to unacceptable print quality after only a relatively short servicable life. It is not uncommon, for example, for a print wheel to have a servicable life of less than one week in a high use environment. In addition, for those applications requiring very high print quality higher energy impaction of the print slug is required. This tends to make the font spread out and disfigure.

One approach in the design of print wheels to provide wheels which withstand greatly increased impact force from the hammer is the composite print wheel described in U.S. Pat. No. 4,037,706. In this composite print wheel the spokes or beams are fabricated from a thin sheet of metal to give them flexibility and strength, and the character slugs or fonts are molded onto the ends of the spokes or beams. The body portion of the slugs in that composite print wheel may be made of such polymeric material as fiberglass reinforced phenolic resin, which is thereafter plated with a metallic wear resistant coating such as a nickel alloy. In this fashion, the beams are like leaf springs which vibrate or oscillate when deflected toward a print station and which quickly retreat back toward their initial position. On the other hand the slugs are made of a hard, wear resistant high modulus material to withstand the impact of the hammer to give high print quality over long periods of time.

Although the composite print wheel of said U.S. Pat. No. 4,037,706 gives high print quality over long periods of time, it is relatively expensive and time consuming to make. Thus there is a need for a print wheel which is economical to make and yet is capable of giving high print qualities over long periods of time while being subjected to the high impact force of modern serial printers.

Accordingly, it is an object of the present invention to provide a print wheel having a long useful life.

It is another object of the present invention to provide a relatively inexpensive integral print wheel.

It is a further object of the present invention to provide an integral print wheel where the character fonts and the spokes have different mechanical properties.

It is a further object of the present invention to provide a method for making polymeric print wheels having hardened and improved character fonts without adversely affecting the flexibility and strength of the spokes or beams.

It is a further object of the present invention to provide a method of modifying the mechanical properties of selected portions of a polymeric structure.

Other objects of the invention will be appreciated from the following description of the invention.

SUMMARY OF THE INVENTION

The above objects are accomplished in accordance with the present invention by a process for selectively hardening and toughening the bulk mass of certain predetermined portions of a pre-formed polymeric structure which includes the steps of contacting the polymeric structure with a multifunctional monomer to diffuse the monomer into the polymeric structure, and irradiating the predetermined portions of the polymeric structure with activating radiation to cause the bulk polymeric material at those portions to be hardened and toughened. In a specific aspect of the present invention, the character fonts of a print wheel made from nylon 66 are contacted with a multifunctional monomer such as N,N,diallylacrylamide, N-allylmethacrylamide, or diallyl adipate which is subsequently exposed to electron beam radiation whereby a structural network of monomer reactive with polymer or mixtures is formed.

It is known in the art to alter the surface properties of polymeric structures, such as fibers and films, by irradiating such polymeric structures in the absence of oxygen and then contacting the surfaces of such polymeric structures with a monomer which is capable of being polymerized in the presence of the free radicals formed by the irradiation process to form a second polymer which may be intricately attached to the surface of the polymeric structure. Such prior art processes are capable of creating surface effects upon shaped polymeric particles. Such surface effects include softness, resilience, dyeability, hydrophilicity, static pickup, etc. However, such prior art processes are limited in that they are intended to alter only the surface properties of the polymeric structures being treated, and they are not effective in altering the bulk properties of such polymeric materials. In addition, such prior art processes are intended to treat the entire surfaces of polymeric structures, and they are not directed to the problem of selectively altering the bulk properties of predetermined portions of polymeric structures.

In accordance with the present invention, a method is provided for selectively altering the properties of the bulk mass of certain portions of a pre-formed integral polymeric structure which includes the steps of contacting the polymeric structure with a multifunctional monomer to diffuse the monomer into the polymeric structure and irradiating said portions of the structure with activating radiation to thereby alter the properties of the bulk mass of the polymeric material at those portions. This invention will now be described in detail as it is applied to a single element integral print wheel made of a polymeric material.

BRIEF DESCRIPTION OF THE DRAWINGS

FIG. 1 is an isometric view of a spindle containing several print wheels which are being treated in a treatment bath.

FIGS. 2 and 3 are side and end views respectively of an apparatus that may be used to irradiate the print fonts of the print wheel.

A single element print wheel, substantially as described in U.S. Pat. No. 3,954,163, the disclosure of which is hereby incorporated by reference, is treated in accordance with the method of the present invention. This print wheel is made of a nylon 66 resin. Although any polymer material, such as a polyamide, is suitable for use in the practice of the present invention, nylon 66 is a particularly preferred polymer material. It is generally a tough and yet sufficiently flexible polymer so that it is a suitable material for making the central base portion and hub as well as the spokes of the single element print wheel. However, nylon 66 is not sufficiently hard and tough for the purposes of the character fonts or slugs or the type elements of the print wheel. As used herein, the terms "character fonts", "character slugs" and "type elements" are used interchangeably to refer to the same thing, i.e., the portions of the print wheel located at the ends of the beams on which the characters to be printed are located. When the type elements are made of a polymer material, and with the greatly increased impact force exerted on the type elements by the hammer in an impact printer, it is particularly important that the type elements be of sufficient hardness so that there would be very little, if any, deformation of the type elements during their lives. It is important to note that such hardness of the type elements is not obtained by merely hardening the surface of the type elements, for example, by coating the surface of the type elements with a nickel alloy as shown in U.S. Pat. No. 4,037,706. This is because even when the surface of a type element is hardened, a relatively soft body mass will permit some plastic flow which would result in the deformation of the character on the type element or it may result in the destruction of the type element. This difficulty is resolved in said U.S. Pat. No. 4,037,706 by the use of two different materials for making the spokes and the type elements. Thus, in the case of single element print wheels, it is not enough to merely harden the surface of the type elements. The body or bulk of the type elements also must be hardened.

In accordance with the method of the present invention, a nylon 66 single element print wheel is contacted with a suitable monomer to diffuse the monomer into the polymeric nylon 66 bulk structure. The monomer may be incorporated into the nylon 66 structure by a number of ways. For example, it may be possible to incorporate the monomer into the nylon 66 formulation prior to the molding of the formulation into the single element print wheel. Alternatively, the monomer may be diffused into the nylon 66 structure by maintaining contact between the monomer and the nylon 66 structure over a sufficiently long period of time. The nylon 66 is generally receptive to the monomer and this receptivity can be enhanced by removing absorbed water. In this regard, when the monomer is to be diffused into the nylon 66 structure, sufficient contact time must be allowed so that the monomer would diffuse into the interior of the nylon 66 structure. The contact time between the monomer and the nylon 66 polymer depends to some extent on the particular monomers employed, but generally it is believed that, for type elements having a thickness of several mils, at least several hours of contact time should be provided. A contact time of a few seconds or a few minutes would be insufficient to permit the monomer to sufficiently penetrate or diffuse into the bulk of the nylon 66 structure. To ensure substantial bulk penetration of the nylon 66 structure by the monomer, we prefer to maintain the contact over a period of several days.

Although mono-functional monomers are usable for the purposes of the invention, we prefer to use multifunctional monomers such as the bi- and tri-functional monomers. By multifunctional monomer it is intended to define those monomers which offer more than one site to react with the polymer or itself when irradiated. Preferably, the monomer is one which is soluble in the polymer or in a solution which is readily absorbed by the polymer. In the case of nylon 66 solubility in water and/or a lower alcohol such as methanol is effective. Any suitable multifunctional monomer may be employed. Examples of suitable monomer include N-allylmethacrylamide; N,N-diallylacrylamide and diallyl adipate and mixtures thereof. When water and/or alcohol soluble monomers are used, the dissolution of the monomer in the carrier liquid advantageously assists the diffusion of the monomer into the nylon 66 structure, particularly when water molecules have been previously removed from nylon 66 along with oxygen molecules. In the case of monomers solubilized in a liquid carrier, the diffusion of the monomer into the nylon 66 structure may be carried out by any convenient means, such as by painting, spraying, dipping and immersion. In the case of nylon 66 print wheels, we prefer to submerge the character pads of the print wheels in the monomer solution as illustrated in FIG. 1. Alternatively, the entire print wheel may be submerged. The amount of monomers to be diffused into the polymer structure depends on the particular monomer and polymer structure employed. In the case of nylon 66 print wheels and N,N-diallylacrylamide, we have found that about 1% by weight to be suitable.

The amount or concentration of monomer in the solution for the diffusion step is not critical so long as an amount of monomer sufficient to harden and toughen the polymeric material can be diffused into the polymer structure within a reasonable amount time. Generally, from about 10% to about 30% of monomer by weight in the solution is a suitable amount of monomer in the solution. This typically provides for about 0.5 to about 3.0 percent monomer by weight of the weight of the polymer structure.

The activating radiation employed should be of the high energy type to readily penetrate the entire bulk or mass of polymer and convert monomer-polymer to their altered state to provide a hardened and toughened bulk mass. We have found that radiation from an electron beam having an energy of at least about 200,000 electron volts to be suitable. Typically the electron beam has an energy greater than 500,000 electron volts. The amount or dosage of radiation required is also relatively high. Generally, we have found that at least about 20 Megarads, and preferably about 50 to about 100 Megarads, may be used. Dosages greater than 100 Megarads may also be used. In this respect, it will be appreciated that the irradiation step in the method of the present invention is distinct from the irradiation steps in the prior art cited above. In the prior art methods, polymeric fibers and films are treated to alter their surface properties, without changing their softness of hand and flexibility. In contrast to those prior art processes, the irradiation step in the method of the present invention is intended to selectively alter the irradiated portions of the polymer structure to make those portions brittle, hard, and tough. It will be appreciated that to maintain high print quality throughout the life of a print wheel, there should be substantially no "spreading out" of the character font which may result from impact induced cold flow of the polymer material.

Since the presence of oxygen during the irradiation step tends to tie up the free radicals formed and degrade the nylon 66 polymer, it is preferred to exclude oxygen from contacting the polymeric structure. This may be accomplished in a number of ways. For example, if the print wheel is taken immediately after being molded or formed and put in an inert atmosphere, such as nitrogen, until it is contacted with the monomer according to the present invention, no difficulty arises. Alternatively, the nylon 66 print wheels which have already been exposed to oxygen in the atmosphere may be subjected to a vacuum or an inert atmosphere to remove or exchange substantially all the oxygen from the polymeric structure.

The precise mechanism involved in hardening and toughening the polymeric structure is not completely clear. While not wishing to be bound to any specific theory, it is believed that the radiation creates a number of free radicals in the polymeric structure which combine with the multifunctional monomer to form a cross-linked polymer. Alternatively or in addition to the formation of such a cross-linked polymer, the multifunctional monomer may form a homopolymer. In either case, it is believed that a structural network of cross-linked polymer, and/or homopolymer is formed which provides a hardened toughened material.

With reference to FIGS. 1, 2 and 3 a preferred manner of accomplishing the two step treatment of the print wheels will be described. In FIG. 1 a spindle 10 has the individual print wheels 11 mounted on it for rotation through a treatment bath 12 held in tub 13. The spindle and tub are placed in a vessel (not shown) which is purged with nitrogen. The volume of treatment solution is maintained such that only the characters are totally submersed in the treatment solution as the spindle is slowly rotated.

FIGS. 2 and 3 illustrate the second phase of the treatment process wherein the character fonts of the print wheel are irradiated. The spindle 10 which is driven by motor 15 is placed in a nitrogen purged plastic bag 20. A lead shield 16 is positioned such that only the character portions are exposed to the electron beam generated by means not shown. Typically the electron beam energy is of the order of about 500 K ev to penetrate the entire thickness of the character and pad. Exposure is determined by the length of time the character font is in the beam and is typically from about 30 to about 50 seconds. This typically provides a radiation dosage of from about 50 to about 100 Megarads. This structure has the advantage that a large number of wheels can be rotated across the entire length of the beam.

The invention will now be further described with reference to the following specific examples. Unless otherwise indicated, all parts and percentages are by weight.

EXAMPLES 1-6

Single element nylon 66 print wheels made as shown in U.S. Pat. No. 3,954,163 were treated in accordance with the method of the present invention. These were compared against untreated control samples which were made as shown in U.S. Pat. No. 3,954,163. In all tests the conditions and procedures were the same except for those wheels treated according to the treatment procedure according to the present invention. The treated print wheels were treated by first subjecting them to the action of vacuum drying to substantially remove oxygen. The oxygen-free print wheels were then submerged in a solution of one part by weight, N,N-diallylacrylamide, one part by weight water, and three parts by weight methyl alcohol. The print wheels were immersed in the solution overnight to ensure complete penetration of the nylon 66 by the monomer. The print wheels were then removed from the solution and packaged under a nitrogen atmosphere into a Ziplock bag. Prior to irradiation, each of the print wheels had a lead shield three inches in diameter and one eighth inch thick attached to the wheel to protect the spokes from the effects of radiation. The packaged print wheels were then treated to the indicated dosage of radiation in 5 Megarad increments. The radiation was provided by an electron beam with 750,000 electron volts. The print wheels so treated were then tested in a Diablo 1345A printer. The results obtained together with the control are tabulated below. The actual life listed is the actual number of impacts before character failure is first observed.

| EX-AMPLE | DOSE MEGARAD | CHAR-ACTER | ACTUAL LIFE ($\times 10^6$) | |
|---|---|---|---|---|
| | | | TREATED | CONTROL |
| 1 | 50 | t | 2.1 | .72 |
| | | i | 1.62 | .59 |
| | | n | 1.19 | .68 |
| | | o | 1.23 | .54 |
| 2 | 50 | t | 2.2 | 1.6 |
| | | i | 2.2 | 1.1 |
| | | p | .11 | .45 |

-continued

| EX-AMPLE | DOSE MEGARAD | CHAR-ACTER | ACTUAL LIFE ($\times 10^6$) TREATED | CONTROL |
|---|---|---|---|---|
|  |  | b | .78 | .33 |
|  |  | u | 1.2 | .44 |
|  |  | — | .26 | .1 |
|  |  | c | 1.2 | .7 |
|  |  | f | 2.1 | .137 |
|  |  | j | 2.1 | .637 |
| 3 | 75 | t | 2.91 | 1.08 |
|  |  | i | 3.56 | .43 |
|  |  | n | 1.84 | 1.08 |
|  |  | o | 1.73 | 1.97 |
| 4 | 100 | t | 3.24 | .65 |
|  |  | i | 1.84 | .65 |
|  |  | n | 2.37 | — |
|  |  | o | .32 | .86 |
| 5 | 100 | t | 3.35 | .54 |
|  |  | i | 2.36 | .54 |
|  |  | n | 1.4 | .43 |
|  |  | o | .86 | .54 |
| 6 | 100 | t | 2.81 | 2.7 |
|  |  | i | 1.19 | .95 |
|  |  | n | 3.02 | .216 |
|  |  | o | 2.48 | .216 |

EXAMPLES 7–12

Single element print wheels were made as in Examples 1–6 except that the dried print wheels were mounted on a spindle such that the wheels are not free to spin independent of the shaft. The spindle of print wheels is then placed in a vessel and the treatment bath described in Examples 1–6 is added to the vessel. The treatment vessel is purged with nitrogen and then placed on its side on a roll mill as illustrated in FIG. 1. The volume of treatment solution is maintained such that only the characters are totally submersed in the treatment solution when the vessel is horizontal. The vessel and spindle are slowly rotated so that only the character pads are immersed in the monomer solution. Sufficient time is allowed for the monomer to diffuse into the characters. The treated print wheels are removed from the vessel and placed in a fixture as illustrated in FIG. 2 which is sealed in a nitrogen purged plastic bag. The lead shield is positioned such that only the character portions are exposed to the electron beam as the spindle is rotated. The print wheels were treated to the indicated dosage of radiation which was provided by an electron beam with 750,000 electron volts. The print wheels so treated were then tested in a Diablo 1345A printer as in Examples 1–6.

| EX-AMPLE | DOSE MEGARADS | CHAR-ACTER | ACTUAL LIFE ($\times 10^6$) TREATED | CONTROL |
|---|---|---|---|---|
| 7 | 50 | n | 1.74 | .54 |
|  |  | o | 1.4 | .32 |
| 8 | 75 | t | 1.69 | .43 |
|  |  | i | 1.19 | .43 |
|  |  | n | .97 | .54 |
|  |  | o | .74 | .32 |
| 9 | 20 | t | 3.8 | 1.73 |
|  |  | i | 2.2 | 0.86 |
|  |  | n | 8.6 | 1.73 |
|  |  | o | 3.8 | 0.86 |
| 10 | 50 | t | 9.0 | .43 |
|  |  | i | 9.0 | .86 |
|  |  | n | 8.6 | 2.8 |
|  |  | o | 8.6 | .86 |
| 11 | 75 | t | 4.7 | 1.73 |
|  |  | i | 1.3 | 1.73 |
|  |  | n | 6.5 | 1.73 |
|  |  | o | 3.5 | .86 |

| EX-AMPLE | DOSE MEGARADS | CHAR-ACTER | ACTUAL LIFE ($\times 10^6$) TREATED | CONTROL |
|---|---|---|---|---|
| 12 | 75 | t | 2.6 | 2.2 |
|  |  | i | 0.8 | 1.29 |
|  |  | n | 4.3 | 2.2 |
|  |  | o | 5.2 | 1.72 |

Testing was terminated in Example 10 prior to failure of any of the treated characters.

EXAMPLES 13–14

The procedure of Examples 1–6 is repeated except that diallyl adipate is substituted for N,N-diallylacrylamide.

| EX-AMPLE | DOSE MEGARADS | CHAR-ACTER | ACTUAL LIFE ($\times 10^6$) TESTED | CONTROL |
|---|---|---|---|---|
| 13 | 50 | t | 4.00 | 1.41 |
|  |  | i | 1.19 | .98 |
|  |  | n | .97 | .76 |
|  |  | o | .43 | .54 |
| 14 | 100 | t | 1.40 | .54 |
|  |  | i | 1.08 | .22 |
|  |  | n | .65 | .43 |
|  |  | o | .54 | .34 |

EXAMPLES 15–16

The procedure of Examples 1–6 is repeated except that N-allylmethacrylamide is substituted for N,N-diallylacrylamide.

| EX-AMPLE | DOSE MEGARAD | CHAR-ACTER | ACTUAL LIFE ($10^6$) TREATED | CONTROL |
|---|---|---|---|---|
| 15 | 20 | f | .35 | .137 |
|  |  | j | 2.03 | .637 |
|  |  | l | 1.62 | None |
| 16 | 20 | f | 1.1 | .137 |
|  |  | j | .845 | .637 |

The above data illustrates the generally dramatic improvement in character life when the character is treated according to the present invention, the improvement being as great as 400% and even more. It should be noted that an improvement of as little as 10 or 15% is substantial when dealing with the relatively long life spans of the print wheels. In these comparatives there are however a very small number of anomalies (Example 2, letter p; Examples 3, 4, letter o; Example 9, letter o; Example 12, letter i; and Example 13, letter o) which do not show improved results. The exact reason for this is not known but it is known that such anomalies are relatively infrequent. Furthermore the standard deviation for the data shown is very large. It is believed that such anomalies may be related to such circumstances as mold defects, printer alignment and adjustment. In any case, the vast array of evidence indicates a substantial and unexpected improvement in print wheel life.

While the invention has been described with particular reference to preferred embodiments, it will be appreciated by the artisan that there are many modifications and alternatives that may be used without departing from the spirit and scope of the invention. It is intended that such modifications and alternatives are part of the present invention when encompassed by the claims which follow.

We claim:

1. A method for selectively hardening and toughening the bulk mass of the character fonts on a polymeric print wheel without adversely affecting the flexibility and strength of the remaining portions of the print wheel which comprises contacting the character fonts of the print wheel with a multifunctional monomer for a time sufficient to diffuse said monomer into said fonts and irradiating the character fonts with activating radiation to cause the bulk of the fonts to be hardened and toughened.

2. A method according to claim 1 wherein said polymeric structure is made of a polyamide.

3. A method according to claim 2 wherein said polymeric structure is made of nylon 66.

4. A method according to claim 1 wherein said monomer is a bifunctional or a tri-functional monomer.

5. The method according to claim 1 wherein the bulk polymeric material is hardened and toughened by the formation of a network of homopolymer of the diffused multifunctional monomer.

6. The method according to claim 1 wherein the bulk polymeric material is hardened and toughened by formation of a network made from the cross-linking of the polymeric material with the multifunctional monomer.

7. The method according to claim 1 wherein the bulk polymeric material is hardened and toughened by formation of a network made from the cross-linking of the polymeric material.

8. A method according to claim 1 wherein oxygen is excluded from contacting said print wheel by providing an inert atmosphere for the print wheel substantially immediately after it is made.

9. A method according to claim 1 wherein said oxygen is excluded from contacting said print wheel by subjecting the print wheel to the action of a vacuum.

10. A method according to claim 1 wherein said monomer is N-allylmethacrylamide, N,N-diallyacrylamide or diallyl adipate or a mixture thereof.

11. A method according to claim 1 wherein said monomer is N,N-diallyacrylamide.

12. A method according to claim 11 wherein said N,N-diallyacrylamide is in a carrier comprising water and methanol.

13. A method according to claim 1 wherein said activating radiation is an electron beam.

14. A method according to claim 13 wherein said electron beam has an energy of at least about 500,000 volts, and wherein said activating radiation is in a total dosage of about 50 Megarads.

15. A method according to claim 1 wherein said monomer is incorporated into said print wheel by contacting at least the character fonts on said print wheel with said monomer for a period sufficient to permit the monomer to diffuse into the interior of the nylon 66.

16. A print wheel made by the method of claim 1.

17. A print wheel made by the method of claim 12.

18. A print wheel made by the method of claim 15.

* * * * *